(12) United States Patent  
Yamada

(10) Patent No.: US 7,514,787 B2
(45) Date of Patent: Apr. 7, 2009

(54) SEMICONDUCTOR DEVICE

(75) Inventor: Shigeru Yamada, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 51 days.

(21) Appl. No.: 11/711,104

(22) Filed: Feb. 27, 2007

(65) Prior Publication Data

US 2007/0273020 A1    Nov. 29, 2007

Related U.S. Application Data

(62) Division of application No. 10/885,785, filed on Jul. 8, 2004, now Pat. No. 7,332,373.

(30) Foreign Application Priority Data

Feb. 20, 2004   (JP) ............... 2004-044787

(51) Int. Cl.
*H01L 23/485* (2006.01)
(52) U.S. Cl. ............... 257/737; 257/781; 257/E23.021
(58) Field of Classification Search .................. 438/613
See application file for complete search history.

(56) References Cited

U.S. PATENT DOCUMENTS

| 5,844,304 | A  | * | 12/1998 | Kata et al. ................. 257/620 |
| 6,476,503 | B1 |   | 11/2002 | Imamura et al. |
| 6,563,207 | B2 |   | 5/2003  | Shinma et al. |
| 6,677,677 | B2 | * | 1/2004  | Kimura et al. ............ 257/737 |
| 6,888,222 | B2 |   | 5/2005  | Shizuno et al. |
| 6,952,048 | B2 |   | 10/2005 | Terui et al. |
| 6,969,916 | B2 |   | 11/2005 | Shizuno et al. |
| 2003/0071284 | A1 | * | 4/2003 | Kanai et al. ................. 257/200 |
| 2004/0089944 | A1 |   | 5/2004 | Watanabe |
| 2004/0150104 | A1 |   | 8/2004 | Terui |
| 2005/0006760 | A1 |   | 1/2005 | Terui |
| 2005/0098891 | A1 |   | 5/2005 | Wakabayashi et al. |
| 2005/0230794 | A1 |   | 10/2005 | Shizuno |

FOREIGN PATENT DOCUMENTS

| JP | 4-373131    | 12/1992 |
| JP | 09-139387   | 5/1997  |
| JP | 2000-332049 | 11/2000 |
| JP | 2001-185568 | 7/2001  |
| JP | 2003-168700 | 6/2003  |

* cited by examiner

*Primary Examiner*—Stephen W Smoot
(74) *Attorney, Agent, or Firm*—Rabin & Berdo, PC

(57) ABSTRACT

The present invention provides a method of manufacturing semiconductor device. The method includes providing a semiconductor wafer having a main surface; defining a chip forming region which includes chip regions defined by scribe lines, and a peripheral region which surrounds the chip forming region, on the main surface; forming circuit elements and electrode pads connected to the circuit elements on the chip areas; forming an insulating film, which exposes respective portions of the electrode pads, on the main surface; forming protruded electrodes on the insulating film provided in the chip areas so that the protruded electrodes are arranged at predetermined intervals in the chip area; forming an encapsulating material, which exposes top faces of the protruded electrodes, on the insulating film; and cutting the semiconductor wafer along the scribe lines.

12 Claims, 8 Drawing Sheets

SEMICONDUCTOR DEVICE

This application is a divisional application of U.S. patent application Ser. No. 10/885,785, filed Jul. 8, 2004, which is a counterpart of Japanese patent application, Serial Number 44787/2004, filed Feb. 20, 2004, the subject matter of which is incorporated herein by reference.

BACKGROUND OF THE INVENTION

1. Field of the Invention

The present invention relates to a method of manufacturing a semiconductor device having a so-called WCSP (Wafer Level Chip Size Package) structure.

2. Description of the Related Art

A package having a size equivalent to that of each of semiconductor chips cut out from a semiconductor wafer is generally called "CSP (Chip Size Package)". CSPs obtained after the semiconductor chips formed on the semiconductor wafer have been sealed with a resin while remaining in a semiconductor wafer state, are called "WCSPs".

The WCSPs are obtained by effecting a fractionalizing process on a structure containing semiconductor devices formed in plural form on a semiconductor wafer in matrix form according to a wafer process.

There has been known a configuration in which dummy plated layers (dummy columnar electrodes) are formed in areas outside a semiconductor substrate with a view toward making more uniformly the heights of columnar electrodes lying in a semiconductor chip forming area in the above-described WCSP manufacturing process (see the following patent document 1).

There has also been known a configuration wherein solder adhering areas are formed around bump forming patterns on a silicon wafer for the purpose of reducing solder bumps and variations in composition ratio (see the following patent document 2).

Further, there has been known a configuration wherein pressure to be applied is varied at the central part of a substrate and its peripheral portion to carry out compressive sealing with a view toward uniformizing the states of sealing at the central part of the substrate and its peripheral portion upon sealing bumps on the substrate with an encapsulating resin (see the following patent document 3).

An outline of the conventional sealing process will now be explained with reference to FIG. 8. FIG. 8 is a schematic partly plan view showing, in a developed form, a partial area of a semiconductor wafer 100 to describe a conventional protruded electrode sealing process.

The semiconductor wafer 100 includes a semiconductor chip forming area 112 and a peripheral area 114 that surrounds the semiconductor chip forming area 112.

The semiconductor chip forming area 112 is partitioned into matrix form as a plurality of semiconductor chip areas 200 by scribe lines L101.

Protruded electrodes (hereinafter might be called "electrode posts or columnar electrodes") 118 spaced away from one another in predetermined distances in a 5×5 matrix form are provided within the semiconductor chip area 200.

Here, space or gap areas including the scribe lines L101, among the adjacent semiconductor chip areas 200 are called "scribe streets 140". Gap areas among adjacent protruded electrodes 118 lying within the same semiconductor chip area 200 are called "protruded electrode-to-protruded electrode areas 142".

A width w100 of the protrude electrode-to-protruded electrode area 142 in the illustrated example is set to a width different from a width w101 of the scribe street 140. Described specifically, the width w100 of the protruded electrode-to-protruded electrode area 142 is smaller than the width w101 of the scribe street 140. When, for example, the number of the protruded electrodes 118 is fewer, the width w100 of the protruded electrode-to-protruded electrode area 142 might be greater than the width w101 of the scribe street 140.

The illustrated example shows the manner in which an encapsulating resin 134 injected into the central part (the upper left in the figure) of the semiconductor wafer 100 is diffused into and flow to the peripheral area 114. Since the width w100 of the protruded electrode-to-protruded electrode area 142 is different from the width w101 of the scribe street 140 as mentioned above, the flow rate of the encapsulating resin 134 flowing to the wide scribe street 140 and the flow rate of the encapsulating resin 134 flowing to the protruded electrode-to-protruded electrode area 142 are also different from each other. That is, the flow rate of the resin that flows to the scribe street 140 becomes faster than the flow rate of the resin that flows to the protruded electrode-to-protruded electrode area 142.

Patent Document 1
Japanese Laid Open Patent Application No. 2000-332049
Patent Document 2
Japanese Laid Open Patent Application No. 9-139387
Patent Document 3
Japanese Laid Open Patent Application No. 2001-185568

According to the conventional WCSP manufacturing method as described above, the interval between the protruded electrodes formed on the semiconductor wafer, particularly, the interval between the protruded electrodes adjacent to each other with the scribe line interposed therebetween, and the interval between the protruded electrodes adjacent to each other within the semiconductor chip area are different from each other. Therefore, the flow rate of the encapsulating resin becomes non-uniform within the semiconductor chip forming area.

When the flow rate of the encapsulating resin becomes non-uniform within each semiconductor chip area in this way, a void (space) designated at reference numeral 135 can happen in FIG. 8. There is also a fear that a distribution of components of an encapsulating resin like, for example, a filler may be biased due to such a non-uniform flow rate.

Thus, since the semiconductor chip formed in the central part of the semiconductor wafer and each semiconductor chip formed in the vicinity of the peripheral edge of the semiconductor wafer are different in component composition of the encapsulating resin from each other, there is a possibility that variations will occur in the electrical characteristics of each semiconductor device.

For example, the patent documents 1 and 2 do not intend to uniformly form the encapsulating rein within the surface of the wafer although the dummy columnar electrodes and the dummy bumps are formed for the purpose of uniformizing the height of each columnar electrode and the height of each solder bump within the surface of the wafer. Also, the patent document 3 aims to uniformly form the encapsulating resin within the surface of the wafer. However, its realizing means depends on a manufacturing apparatus. Since a die having a complex elevating mechanism is required to realize such a manufacturing apparatus, a capital investment will mount and the manufacturing cost of the semiconductor device will rise consequently. Since such a manufacturing apparatus becomes complicated in operation and adjustment, there is a fear that the quality of each fabricated semiconductor device may vary.

SUMMARY OF THE INVENTION

The present invention has been made in view of the foregoing problems. It is therefore an object of the present invention to provide a method of manufacturing a WCSP, which is capable of sealing protruded electrodes with satisfactory accuracy and to suppress variations in the quality (sealing level and electrical characteristic or the like) of each of a plurality of semiconductor devices simultaneously manufactured from the same semiconductor wafer.

According to one aspect of the present invention, for achieving the above objects, there is provided a method of manufacturing semiconductor device, which includes providing a semiconductor wafer having a main surface; defining a chip forming region which includes chip regions defined by scribe lines, and a peripheral region which surrounds the chip forming region, on the main surface; forming circuit elements and electrode pads connected to the circuit elements on the chip areas; forming an insulating film, which exposes respective portions of the electrode pads, on the main surface; forming protruded electrodes on the insulating film provided in the chip areas so that the protruded electrodes are arranged at predetermined intervals in the chip area; forming an encapsulating material, which exposes top faces of the protruded electrodes, on the insulating film; and cutting the semiconductor wafer along the scribe lines.

According to the semiconductor device manufacturing method of the present invention, the present method is capable of overcoming the problems such as the occurrence of the void in the semiconductor chip forming area and the non-uniform distribution of the components of the encapsulating resin, which have unavoidably been produced due to the serious factor that the flow rate of the encapsulating resin is non-uniform within each semiconductor chip area, and of sealing the protruded electrodes with satisfactory accuracy. Accordingly, a plurality of semiconductor devices simultaneously manufactured from the same semiconductor wafer can be made uniform in quality.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1A:
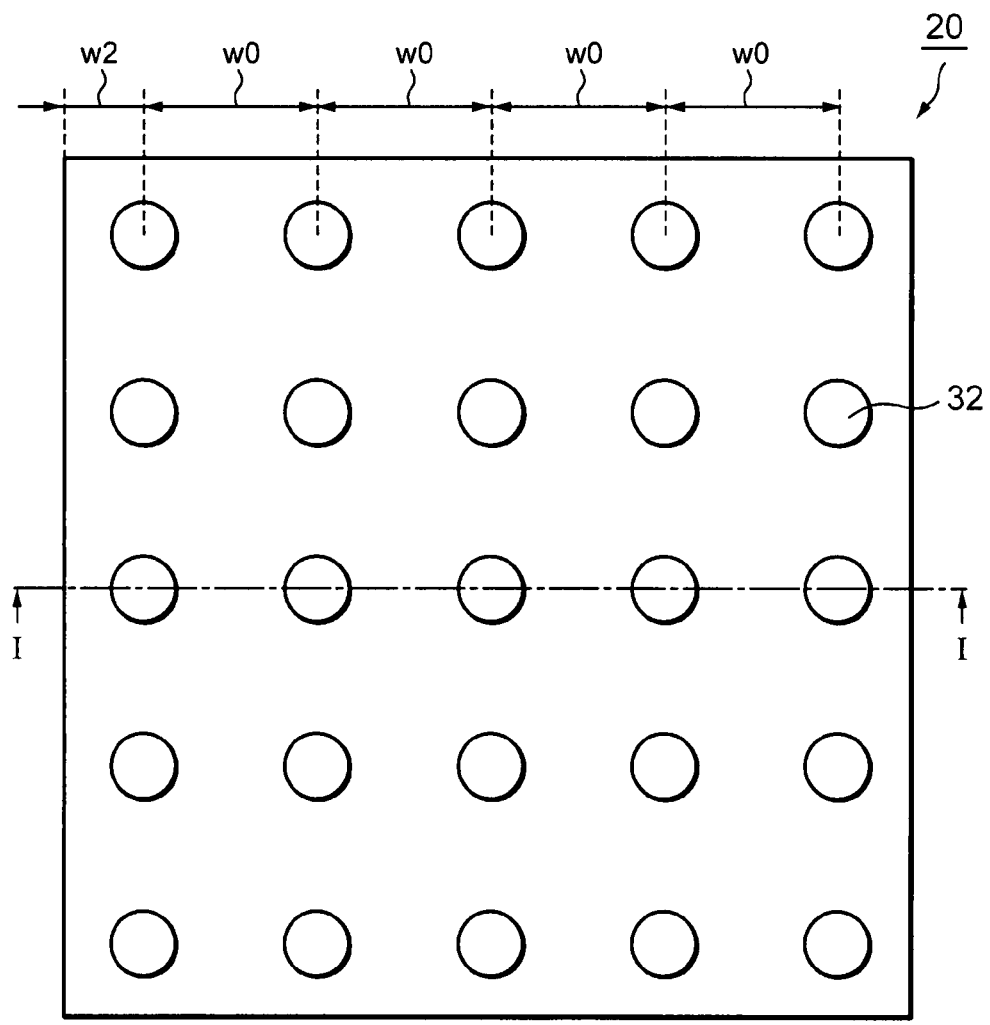
FIG. 1(A) is a schematic plan view for describing a configuration of a semiconductor device.

Preferred embodiments of the present invention will hereinafter be described with reference to the accompanying drawings. Incidentally, the drawings merely schematically show the shape, size and positional relationships of respective components to such a degree that the present invention can be understood. Thus, the present invention is not limited in particular. Incidentally, although specific materials, conditions and numerical conditions or the like might be used in the following description, they are simply preferred examples. Thus, no limitations are imposed on them. It is to be understood that similar components illustrated in the respective drawings used for the following description are respectively identified by the same reference numerals, and the description of certain common components might be omitted.

A configuration of a semiconductor device (semiconductor chip) manufactured by a semiconductor device manufacturing method of the present invention will first be explained with reference to FIG. 1.

Figure 1B:
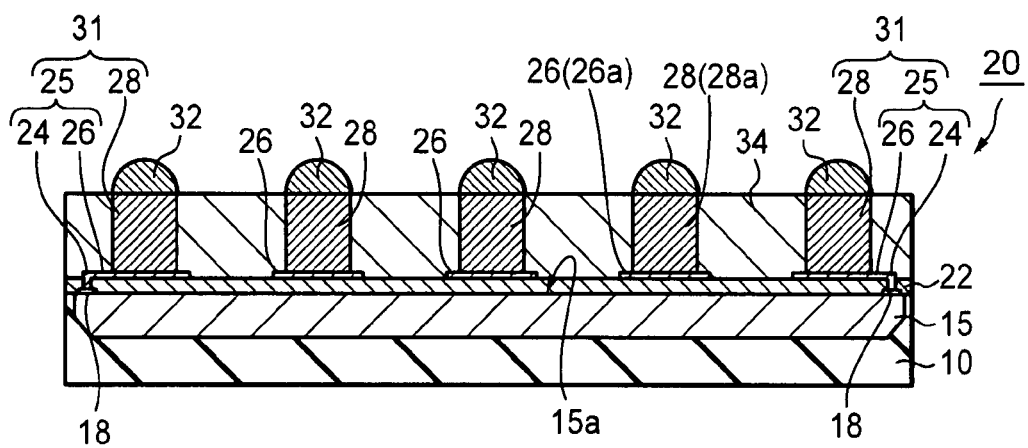
FIG. 1(B) is a schematic view showing a cut area cut along dashed line indicated by I-I' of FIG. 1(A)

FIG. 1(A) is a schematic plan view for describing a configuration of a semiconductor device (semiconductor chip) 20 obtained by a manufacturing method of the present invention, and FIG. 1(B) is a schematic view showing a cut portion or area cut along dashed line indicated by I-I' of FIG. 1(A), respectively.

The semiconductor device 20 includes a semiconductor substrate (semiconductor wafer) 10. The semiconductor substrate 10 includes an area in which a circuit device or element 15 is formed. The circuit element 15 normally comprises a plurality of active elements each having an integrated circuit such as an LSI.

A surface 15a of the circuit element 15 serves as part of a main surface of the semiconductor substrate 10.

Multilayered wiring structures (not shown and hereinafter called also "internal wirings") are normally formed in the circuit element 15.

They are formed such that these plural active elements can fulfill predetermined functions in cooperation with one another. A plurality of electrode pads (hereinafter called also "circuit element connecting pads or land portions") 18 connected to the circuit element 15 and wiring structures 31 are provided on the surface 15a. The plurality of circuit element connecting pads 18 are provided along the peripheral edge of the semiconductor chip 20 so as to become identical in pitch (interval) between the adjacent circuit element connecting pads 18.

As shown in FIG. 1(B), an insulating film 22 is formed on the surface 15a so as to expose respective parts of the circuit element connecting pads 18.

The wiring structures 31 are connected to the circuit element connecting pads 18 exposed from the insulating film 22 by means of a so-called fan-in system.

Each of the wiring structures 31 comprises a protruded electrode 28 used as an electrode, which is electrically connected to its corresponding external terminal 32, and a redistribution wiring layer 25 which electrically connects the protruded electrode 28 and the circuit element connecting pad 18. Incidentally, the portion of the redistribution wiring layer 25, which is located below the protruded electrode 28, will be described as a protruded electrode pad 26. The other portion thereof will be explained as a wiring 24. The protruded electrode 28 is provided on its corresponding protruded electrode pad 26 and electrically connected thereto.

Internal dummy protruded electrode pads 26a and internal dummy protruded electrodes 28a respectively provided on the internal dummy protruded electrode pads 26a are provided in the semiconductor device 20 fabricated by the manufacturing method of the present invention (the details thereof will be described later).

The internal dummy protruded electrode pads 26a and the internal dummy protruded electrodes 28a respectively provided on the internal dummy protruded electrode pads 26a are formed in the same layer as the redistribution wiring layer 25. These internal dummy protruded electrode pads 26a and internal dummy protruded electrodes 28a respectively provided on the internal dummy protruded electrode pads 26a may take such a configuration as not to be connected to both the wiring structures 31 and circuit element connecting pads 18. Alternatively, they may take such a configuration as to be connected thereto but not to be used, that is, they may take such a configuration as to be connected thereto but do not function electrically (so as not to be allowed to function electrically).

The wiring 24 that constitutes one end of the wiring structure 31 is electrically connected to its corresponding top face of the circuit element connecting pad 18 via a through hole defined in the insulating film 22. On the other hand, the protruded electrode pad 26 is connected to its corresponding wiring 24 and formed so as to extend on the insulating film 22. The protruded electrode 28 that constitutes the other end of the wiring structure 31 is formed on its corresponding protruded electrode pad 26.

The protruded electrode pads 26 and the internal dummy protruded electrode pads 26a are provided on the insulating film 22. Preferably, these protruded electrode pads 26 and internal dummy protruded electrode pads 26a are spaced away from one another at equal intervals in association with the layout positions of the external terminals 32 and disposed on the insulating film 22.

The cylindrical or columnar protruded electrodes 28 are respectively disposed on the protruded electrode pads 26 and the internal dummy protruded electrodes 28a are respectively disposed on the internal dummy protruded electrode pads 26a, respectively, at equal intervals in matrix form. At this time, the interval between the internal dummy protruded electrode 28a and the protruded electrode 28 adjacent thereto is also set as w0. That is, the intervals among all the protruded electrodes 28 including the internal dummy protruded electrodes 28a adjacent to one another in row and column directions are set to the intervals (w0) equal to one another.

An encapsulating portion 34 is provided on the insulating film 22 formed with the wiring structures 31 so as to bury the protruded electrodes 28 and the internal dummy protruded electrodes 28a. At this time, the top faces of the protruded electrodes 28 and the internal dummy protruded electrodes 28a are exposed from the encapsulating portion 34.

A plurality of the external terminals 32 corresponding to solder balls, for example, are connected to and disposed on their corresponding top faces of the protruded electrodes 28 and internal dummy protruded electrodes 28a exposed from the encapsulating portion 34. In the illustrated example, 25 external terminals equivalent to 5×5 are provided at predetermined intervals. Incidentally, since the internal dummy protruded electrodes 28a do not function electrically, such a configuration that the external terminals 32 are not provided on the top faces may be adopted.

These external terminals 32 are provided in such a manner that the intervals (intervals among the centers of the external terminals 32 and the centers of the external terminals 32) w0 among the external terminals 32 adjacent to one another become identical. Since, at this time, the interval w2 between the edge of the semiconductor chip 20 and the 25 outermost external terminal 32 is an area that disappears according to a scribe process, the present interval is smaller than ½ of the interval w0.

First Embodiment

A manufacturing method according to a first embodiment will be explained with reference to FIGS. 2 through 5.

FIGS. 2(A), 2(B), 2(C) and 2(D) are respectively schematic views each showing a cut area cut along dashed line indicated by I-I' of FIG. 1(A) with one semiconductor device being in the course of its manufacture as a representative in order to describe a manufacturing process.

Figure 3:
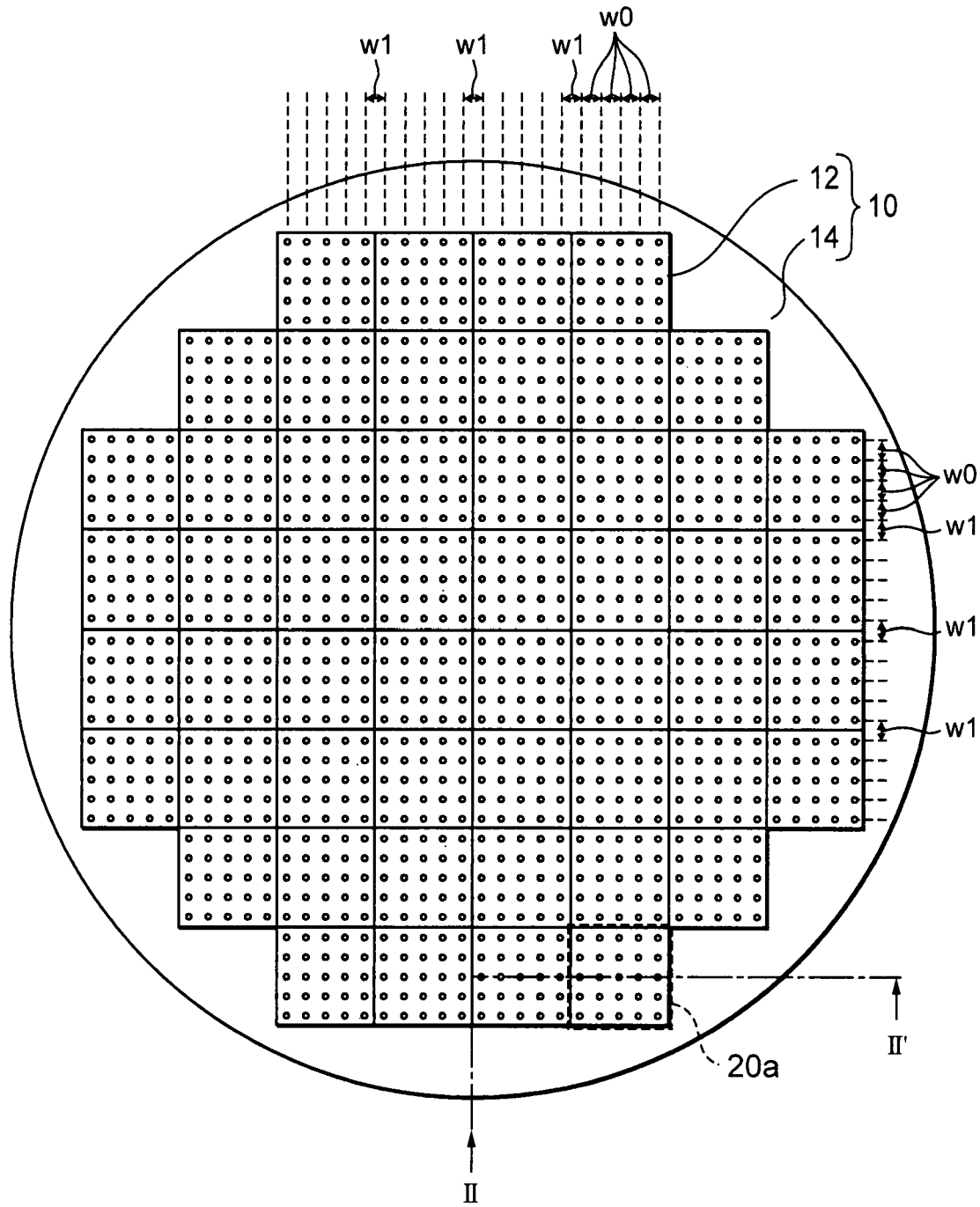
FIG. 3 is a schematic plan view illustrating an overall semiconductor wafer according to a first embodiment at the time that a protruded electrode forming process has been terminated.

FIG. 3 is a schematic plan view showing the overall semiconductor substrate 10 at the time that a protruded electrode forming process to be described later has been completed.

Figure 4:
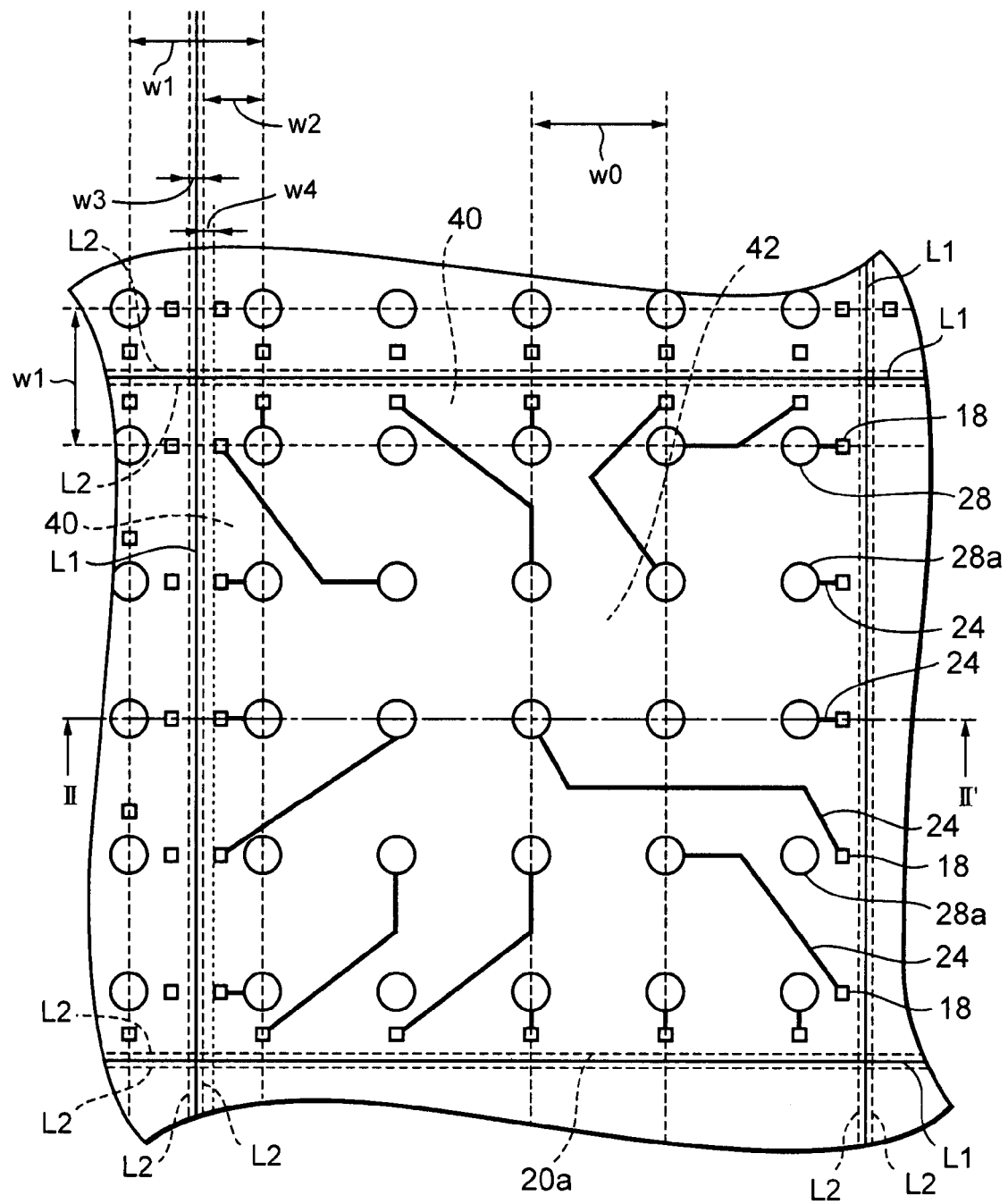
FIG. 4 is a plan enlarged view showing in a developed form, a semiconductor chip area shown in FIG. 3 and its neighborhood.

FIG. 4 is a plan enlarged view showing, in a developed form, a semiconductor chip area 20a shown in FIG. 3 and its neighborhood.

Figure 5:
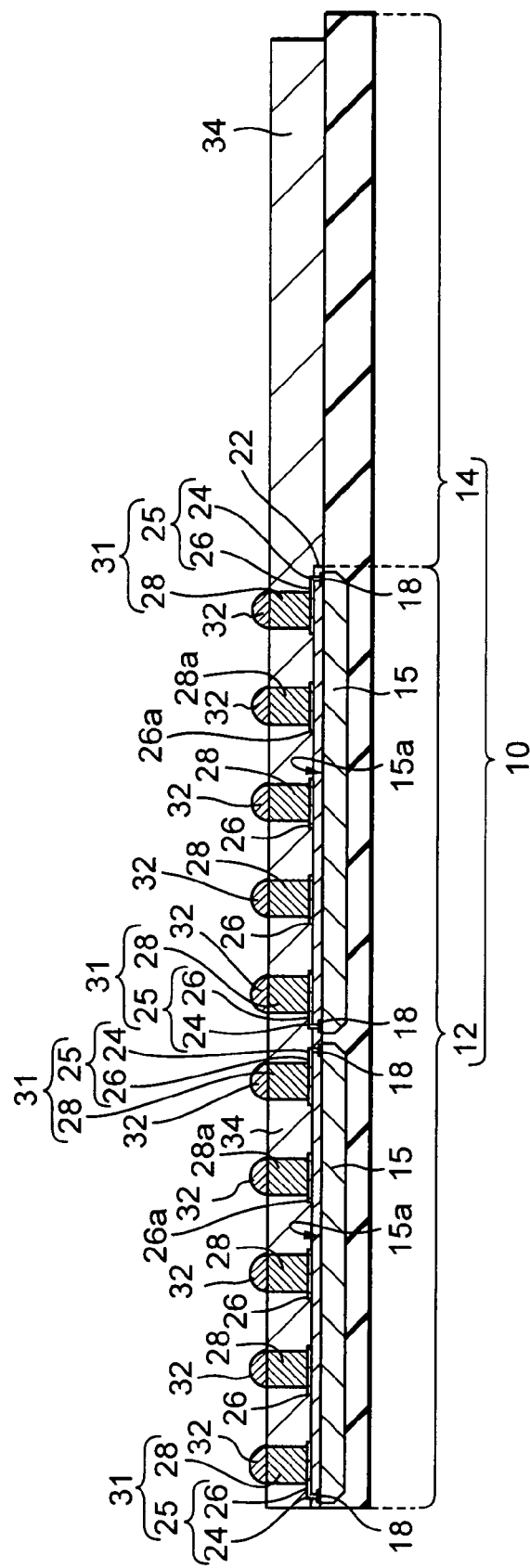
FIG. 5 is a schematic view showing a cut area obtained by cutting the semiconductor wafer of the first embodiment immediately preceding an individualizing process, which has terminated a wafer process, along dashed line indicated by II-II' of FIG. 3.

FIG. 5 is a schematic view showing a cut area obtained by cutting the semiconductor substrate 10 immediately preceding an individualizing or fractionalizing process, which has terminated a wafer process, at a position expressed in dashed line indicated by II-II' of FIG. 3.

The semiconductor device of the present invention is obtained by being cut and fractionalized from the semiconductor substrate 10 along scribe lines L1.

As shown in FIG. 4, the semiconductor substrate 10 is formed with the scribe lines L1 in lattice form. The semiconductor devices 20 are respectively formed in areas partitioned by the scribed lines L1.

When scribing is done along the scribe lines L1, areas near both sides of the scribe lines L1 disappear slightly. Thus, the edges of actually-fabricated semiconductor devices 20 extend along lines placed in positions shifted by predetermined distances to both sides of the scribe lines L1 with the scribe lines L1 as the centers, i.e., lines indicated by L2 in the figure. Accordingly, the lines L2 might be called "edge lines L2".

As shown in FIG. 3, a semiconductor chip forming area 12 and a peripheral area 14 that surrounds it exist in the semiconductor substrate 10 corresponding to, for example, a silicon (Si) substrate in a compartmentalized fashion. The semiconductor chip forming area 12 corresponds to an area in which circuit elements 15 containing a plurality of active elements or the like are fabricated and built therein according to the normal wafer process (see FIG. 2(A)).

The circuit elements 15 are interconnected with one another by multilayered wiring structures (not shown) each formed of an alloy containing Al (Aluminum), an alloy containing Au (gold) or the like and formed so as to be capable of fulfilling predetermined functions.

Circuit element connecting pads 18 constituted with a kind of alloy selected from, for example, an alloy containing Al (Aluminum), an alloy containing Au (gold) and an alloy containing Cu (Copper) as the material are formed on the surface 15a of each circuit element 15. Incidentally, the respective circuit element connecting pads 18 are provided within an area surrounded by the scribe lines L1 as close as to and in parallel with the scribe lines L1. These pads 18 are limited to the case in which they are constituted using only the above alloy as the material. They can be formed of an arbitrary and suitable metal material.

Next, polyimide used as, for example, an insulating material is coated on the semiconductor substrate 10 with a thickness of about 10 μm by the conventional known spin coat method (spin applying method) or the like to form an insulating film 22. The insulating film 22 is formed so as to expose the respective parts of the circuit element connecting pads 18. Preferably, the insulating film 22 may be formed so that its upper surface becomes flat.

Described specifically, for example, the insulating film 22 is formed over the whole surface of the semiconductor substrate 10. Thereafter, openings that reach the circuit element connecting pads 18 are formed from the insulating film 22 by the known photolithography technology and the parts of the circuit element connecting pads 18 may be exposed.

Figure 2A:
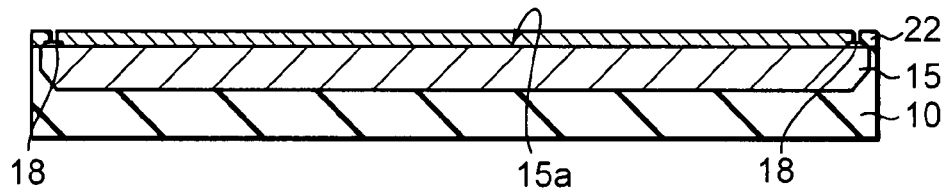
FIGS. 2(A), 2(B), 2(C) and 2(D) are respectively schematic views each showing a cut area cut along dashed line indicated by I-I' of FIG. 1(A) with one semiconductor device being in the course of its manufacture as a representative in order to describe a manufacturing process.
Figure 2B:
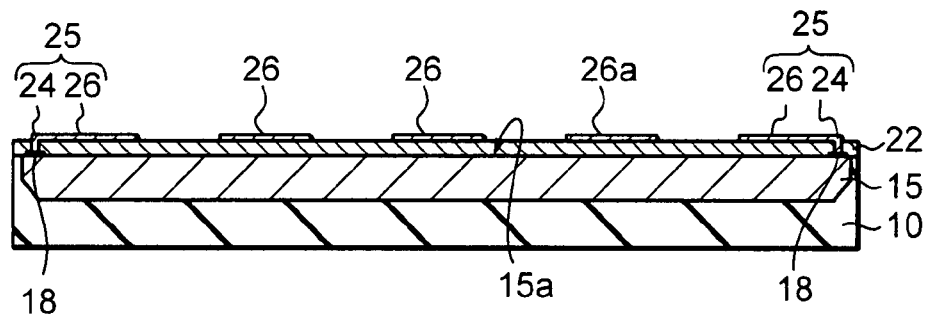

Next, redistribution wiring layers 25, which are connected to their corresponding circuit element connecting pads 18 and lead out from the exposed circuit element connecting pads 18 to above the insulating film 22, are formed as shown in FIG. 2(B).

As shown in FIG. 4, wirings 24 that lead out from the exposed circuit element connecting pads 18 to the inner side of the semiconductor chip area 20a by the so-called fan-in system, and protruded electrode pads 26 connected to their corresponding wirings 24 are formed as parts of the redistribution wiring layers 25.

At this time, no internal dummy protruded electrode pads 26a are connected to both the wirings 24 and the protruded electrode pads 26. These protruded electrode pads 26 and internal dummy protruded electrode pads 26a are respectively formed on the same insulating film 22 as parts of the redistribution wiring layers 25, using the same material as that for the circuit element connecting pads 18 and according to the same process as the process of forming the circuit element connecting pads 18.

A process for manufacturing the redistribution wiring layer 25 will now be explained. A metal film that reaches each of the exposed circuit element connecting pads 18, is first provided on the insulating film 22.

As shown in FIG. 2(B) and FIG. 5, the metal film is patterned by the known photolithography technology with the wirings 24 corresponding to arbitrary and suitable patterns and the protruded electrode pads 26 connected thereto, and the internal dummy protruded electrode pads 26a as the redistribution wiring layers 25.

Subsequently, protruded electrodes 28 and internal dummy protruded electrodes 28a are formed on the formed redistribution wiring layers 25. This process is done as, for example, a process for plating copper (Cu) used as a conductor by the conventional known method and thereafter removing resists patterned by the known photolithography technology with each resist as a mask, whereby the protruded electrodes 28 and the internal dummy protruded electrodes 28a are formed.

These protruded electrodes 28 and the internal dummy protruded electrodes 28a may suitably be configured as columns whose sectional shapes normal to their extending directions become circles ranging from about 100 μm to about 250 μm in diameter as general levels.

As shown in FIGS. 3 and 4, a width w1 of each of scribe streets 40 and a width w0 of an area 42 between the protruded electrodes are set equal to each other. That is, the protruded electrodes 28 and the internal dummy protruded electrodes 28a are disposed in such a manner that the intervals among the protruded electrodes 28 and the intervals among the protruded electrodes 28 and the internal dummy protruded electrodes 28a become equal respectively.

Figure 2C:
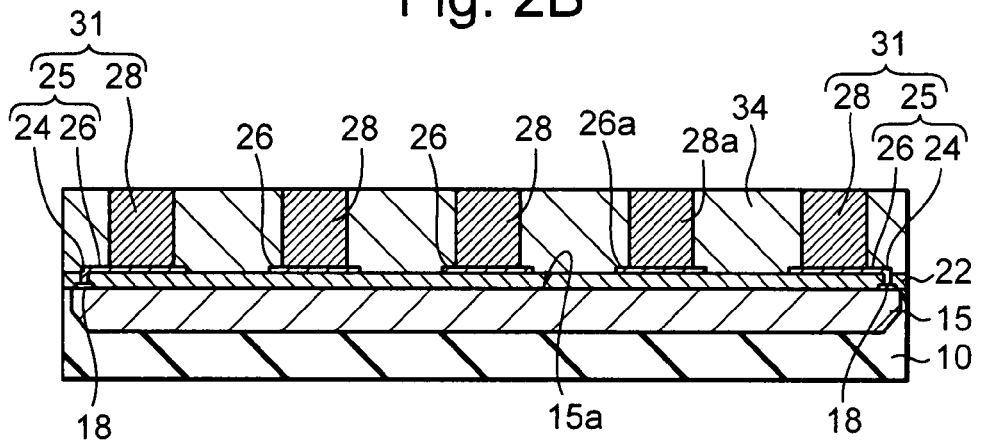

Thereafter, as shown in FIG. 2(C), an encapsulating portion 34 is formed by the conventional known transfer mold method or printing method, using, for example, the conventional known encapsulating resin such as an epoxy mold resin, a liquid sealant.

Described specifically, an encapsulating resin is injected into or applied to partial areas of the semiconductor chip forming area 12 or the peripheral area of the semiconductor substrate 10.

Pressure is applied to the encapsulating resin by a die or squeegee. In doing so, the encapsulating resin flows so as to cover the scribe streets 40 partitioned by the protruded electrodes 28 and internal dummy protruded electrodes 28a shown in FIG. 4, the areas 42 among the protruded electrodes and their upper surfaces, and the surface of the semiconductor substrate 10, i.e., the peripheral area 14 and the semiconductor chip forming area 12. Thus, the encapsulating resin is formed on the semiconductor substrate 10 at a height equivalent to about 1.5 times the height of each of the protruded electrodes 28 and internal dummy protruded electrodes 28a.

Next, as shown in FIG. 2(C), grinding or the like is made to the surface of the encapsulating resin to expose the top faces of the protruded electrodes 28 and internal dummy protruded electrodes 28a from the encapsulating portion 34.

An arbitrary and suitable process necessary for design may be effected on the exposed top faces of either one or both of the protruded electrodes 28 and internal dummy protruded electrodes 28a. When the material for the protruded electrodes 28 and internal dummy protruded electrodes 28a is used as copper, for example, a thin Ni (Nickel) film may be formed on these top faces as a barrier metal layer.

Figure 2D:
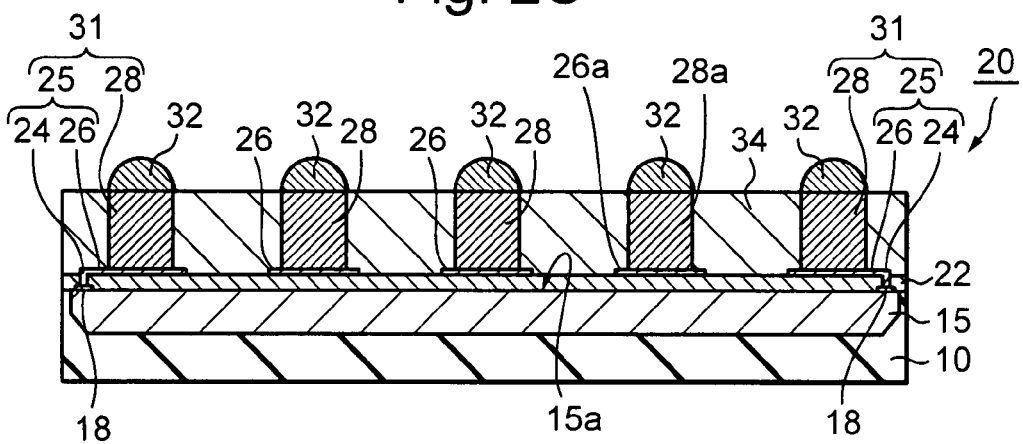

Subsequently, as shown in FIG. 2(D), external terminals 32 are formed by executing a printing and reflow process corresponding to the known method, or the mounting of solder balls or the like and a reflow process.

As shown even in FIG. 5, the packaging of the semiconductor device at a wafer level, according to the present embodiment is completed at this time.

Next, the semiconductor wafer 10 placed in the state in which the packaging has been ended is fractionalized by being cut along the scribe lines L1 shown and described in FIG. 4. Thus, a plurality of the semiconductor chips 20 of the first embodiment each having the same structure can be manufactured from one semiconductor substrate 10.

With reference to FIG. 4, a description will now be made of general levels of the width w0 of each protruded electrode-to-protruded electrode area 42, the width w1 of each scribe street 40, the distance w2 from the edge line L2 of the semiconductor chip 20 subsequent to the fractionalizing process to the center of the diameter of each protruded electrode 28, the interval w3 between the adjacent edge lines L2, and the distance w4 from the edge line L2 to the edge of each circuit element connecting pad 18.

The width w0 of the protruded electrode-to-protruded electrode area 42 is generally set to about twice the diameter of each protruded electrode. Thus, if the diameter of the protruded electrode 28 is set to the range of 100 µm to 250 µm as mentioned above, then the width w0 may preferably be set to about 200 µm to about 500 µm. The width w1 of the scribe street 40 according to the present invention is characterized by being made equal to the width w0 of the protruded electrode-to-protruded electrode area 42. Thus, the width w1 of the scribe street may preferably be set to about 200 µm to about 500 µm according to the determined w0. The interval w3 between the adjacent edge lines L2, corresponding to an area that disappears by scribe in the fractionalizing process, is called also "scribe line width" but may preferably be set to about 50 µm to about 100 µm. The interval w4 from the edge line L2 to the edge of the circuit element connecting pad 18 may be set suitably at random within a range free of impairment of the function of the semiconductor chip. The interval w4 can generally be set to about 40 µm to about 100 µm.

Accordingly, the interval w2 from the edge line L2 to the center of the diameter of each protruded electrode 28 results in an interval obtained by subtracting ½ of the interval w3 from ½ of each of the intervals w0 and w1.

Although the present embodiment has explained the case in which the wirings 24 that lead out by the fan-in system and the protruded electrode pads 26 connected to the wirings 24 are formed as the parts of the redistribution wiring layers 25, it may of course be feasible to form the protruded electrode pads 26 located outside the circuit element connecting pads 18 as the parts of the redistribution wiring layers 25 and form the protruded electrodes 28 thereon as a fan-out system, for example.

Further, although the present embodiment has explained the configuration in which the internal dummy protruded electrode pads 26a are formed so as not to be connected to both the wirings 24 and the protruded electrode pads 26, they may be set to such a configuration as to be connected thereto but unused, i.e., connected thereto but defunct electrically (so as not to be allowed to function electrically).

As described above, the width w1 of the scribe street 40 and the width w0 of the protruded electrode-to-protruded electrode area 42 are set equal to each other. Accordingly, the encapsulating resin is diffused into the scribe streets 40 and the protruded electrode-to-protruded electrode areas 42 at the same speed. Thus, the composition of the encapsulating resin that covers each semiconductor chip forming area 12 can be made uniform at a point where it is first injected or applied, and an achievement point where the resin diffused from the injected or applied point is diffused and finally reaches. Further, the occurrence of void or non-charged areas can be suppressed in the semiconductor chip forming area 12.

Second Embodiment

A method of manufacturing a semiconductor device, according to a second embodiment of the present invention will be described with reference to FIGS. 6 and 7. Since a semiconductor chip manufactured by the manufacturing method of the present embodiment is similar in configuration to the semiconductor chip manufactured by the manufacturing method of the first embodiment, its detailed description will be omitted.

Figure 6:
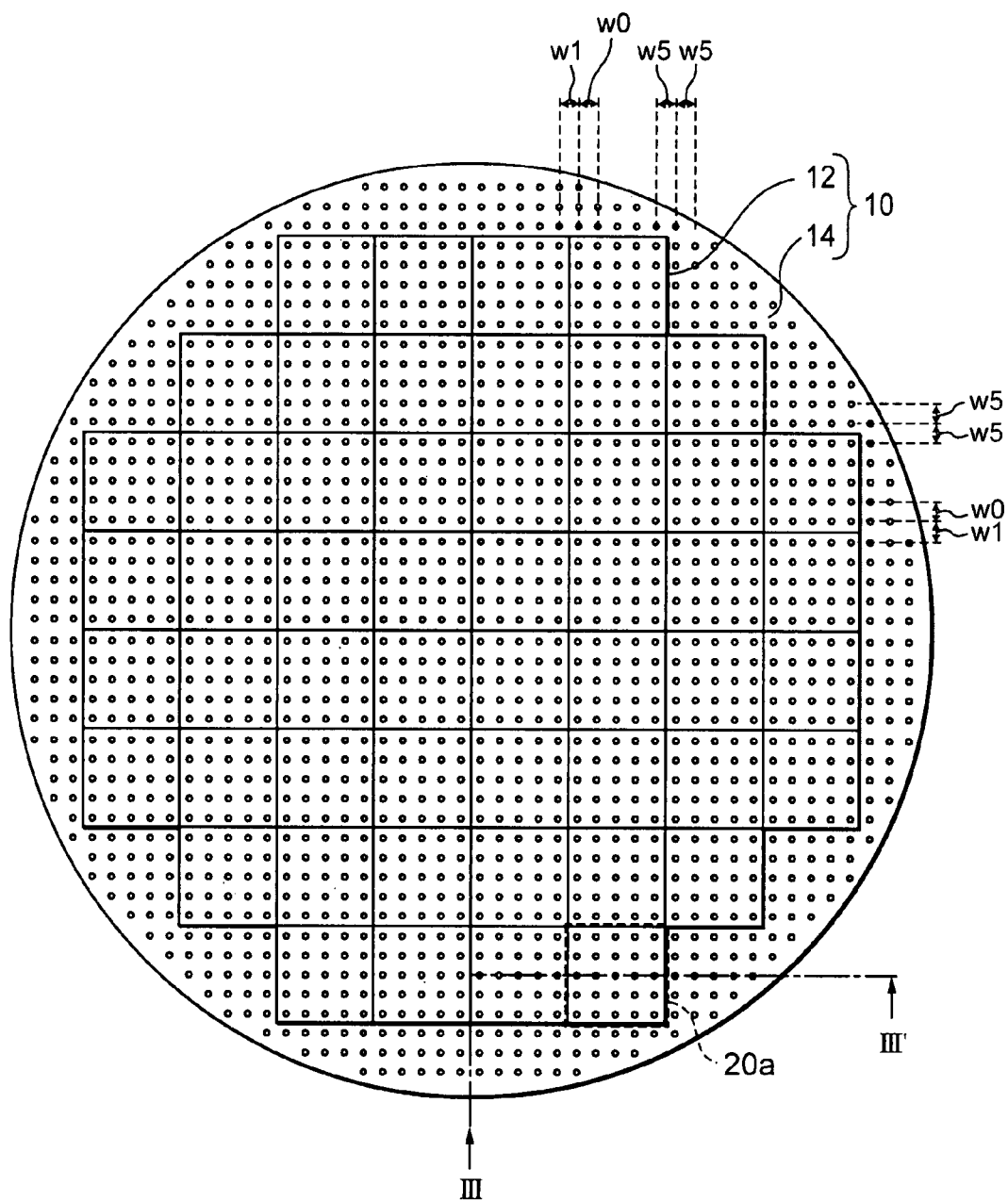
FIG. 6 is a schematic plan view illustrating an overall semiconductor wafer according to a second embodiment at the time that a protruded electrode forming process has been finished.

FIG. 6 is a schematic plan view illustrating an overall semiconductor substrate 10 at the time that a protruded electrode and internal dummy protruded electrode forming process to be described later has been completed.

Figure 7:
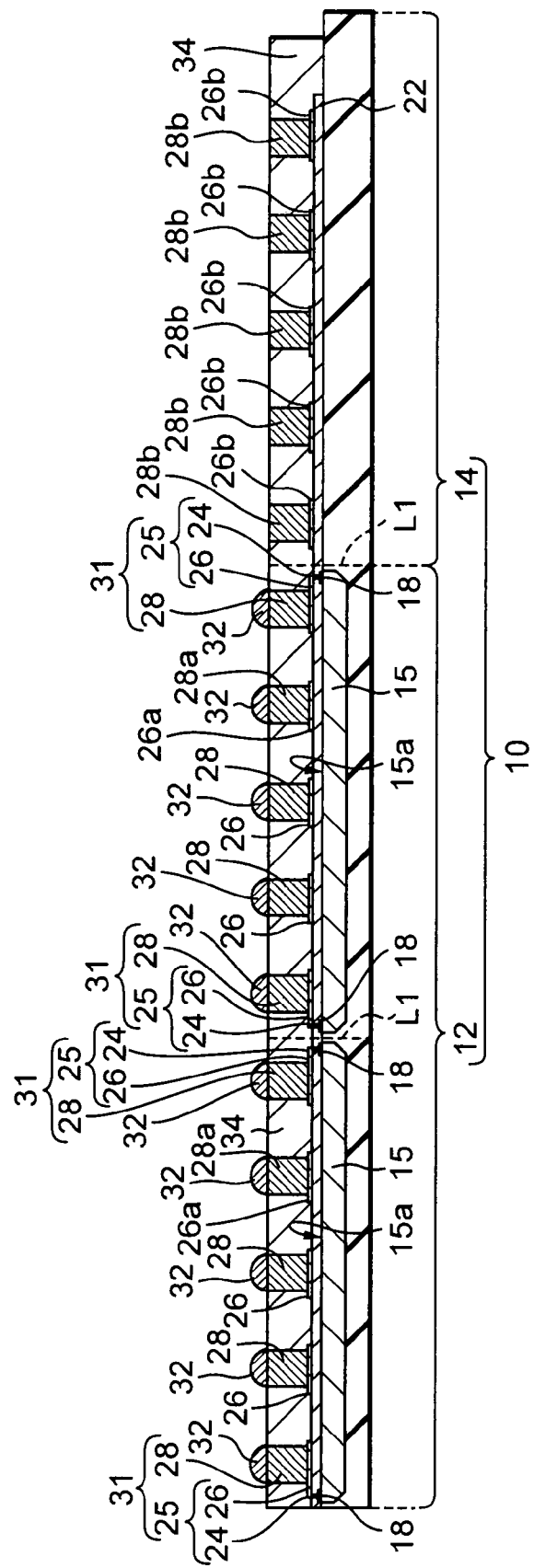
FIG. 7 is a schematic view showing a cut area obtained by cutting the semiconductor wafer of the second embodiment immediately preceding an individualizing process, which has terminated a wafer process, along dashed line indicated by III-III' of FIG. 6.
Figure 8:
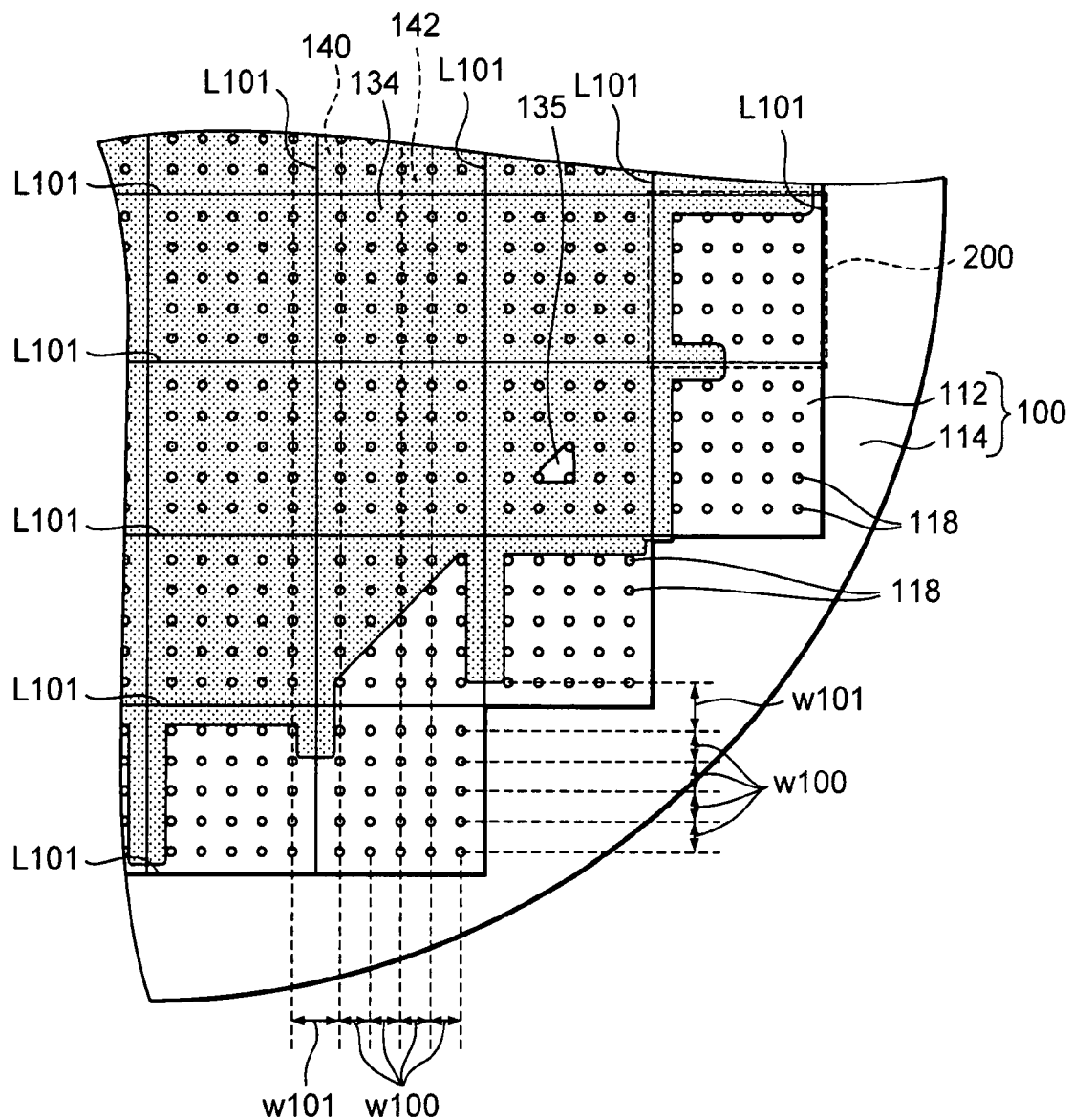
FIG. 8 is a view for describing a prior art.

FIG. 7 is a schematic view showing a cut area obtained by cutting the semiconductor substrate 10 immediately preceding an individualizing process, which has terminated a wafer process, along dashed line indicated by III-III' of FIG. 6.

The method of manufacturing the semiconductor device, according to the present embodiment is characterized by including a process for forming external dummy protruded electrode pads 26b and external dummy protruded electrodes 28b within a peripheral area 14 of the semiconductor substrate 10 in a process for forming redistribution wiring layers and a process for forming protruded electrodes as shown in FIGS. 6 and 7. Since the selection of materials in other processes except for these processes and their conditions are similar to those already described in the first embodiment, the redistribution wiring layer forming process and the protruded electrode forming process will principally be explained. The processes similar to the first embodiment will be omitted in terms of their detailed description.

As shown in FIGS. 6 and 7, the setting of scribe lines L1, the formation of circuit elements 15, the formation of circuit element connecting pads 18 and the process of forming an insulating film 22 are sequentially carried out in a manner similar to the first embodiment.

Next, wirings 24 that lead out by a so-called fan-in system and protruded electrode pads 26 respectively connected to the wirings 24 are formed as redistribution wiring layers 25 from the exposed circuit element connecting pads 18 to each semiconductor chip area 20a in a manner similar to the first embodiment.

Further, the internal dummy protruded electrode pads 26a non-connected to both the wirings 24 and the circuit element connecting pads 18 may be formed, as desired, on the same insulating film 22 as parts of the redistribution wiring layers 25, using the same material as that for the circuit element connecting pads 18 and according to the same process as the process of forming the circuit element connecting pads 18.

In addition, in the manufacturing method of the semiconductor device, according to the present embodiment, external dummy protruded electrode pads 26b non-connected to any of the wirings 24, the circuit element connecting pads 18 and internal dummy protruded electrode pads 26a may further be formed on the same insulating film 22 within the peripheral area 14, using the same material as that for the circuit element connecting pads 18 and according to the same process as the process of forming the circuit element connecting pads 18.

The details of the process of manufacturing the redistribution wiring layers 25 in the second embodiment can be placed under the same conditions as those for the manufacturing process of the first embodiment.

Subsequently, protruded electrodes 28, internal dummy protruded electrodes 28a and external dummy protruded electrodes 28b are simultaneously formed on the formed protruded electrode pads 26, internal dummy protruded electrode pads 26a and external dummy protruded electrode pads 26b according to the same process as one described in the first embodiment. Preferably, a plurality of (a plurality of rows of) external dummy protruded electrodes 28b corresponding to the maximum possible number thereof surround scribe lines L1 defining the semiconductor chip forming area 12 (see FIGS. 4 and 7) and are formed within the peripheral area 14.

At this time, as shown in FIGS. 6 and 7, the interval w1 between the adjacent protruded electrodes 28 with the scribe line L1 interposed therebetween, the intervals w0 between the adjacent protruded electrodes 28 in the semiconductor chip area 20a and between the protruded electrode 28 and the internal dummy protruded electrode 28a, and the intervals w5 between the external dummy protruded electrodes 28b and between the internal electrode 28 and the external dummy protruded electrode 28b are respectively arranged as intervals equal to one another.

Thereafter, an encapsulating portion 34 and external terminals 32 are formed in a manner similar to the first embodiment.

Next, the semiconductor substrate 10 placed in the state in which resin encapsulation has been completed, is fractionalized by being cut along the scribe lines L1. Thus, a plurality of the semiconductor chips 20 each illustrative of the second embodiment, each of which has the same structure, can be fabricated from one semiconductor substrate.

In the description of the present embodiment, the example in which the external dummy protruded electrodes 28b corresponding to the maximum possible number are formed within the peripheral area 14, has been explained in an illustrated form as a preferred example. However, the external dummy protruded electrodes 28b may take such a configuration as to be formed with the scribe lines L1 (see FIGS. 4 and 7) defining the semiconductor chip forming area 12 being surrounded in a single ply (row).

Although the present embodiment has explained the example in which the wirings 24 that lead out by the fan-in system, and the protruded electrode pads 26 respectively connected to the wirings 24 are formed as the parts of the redistribution wiring layers 25, it may of course be feasible to form the protruded electrode pads 26 located outside the circuit element connecting pads 18 as parts of the redistribution wiring layers 25 and form the electrode pads 28 thereon as a fan-out system, for example.

Although the present embodiment has explained the configuration that the internal dummy protruded electrode pads 26a and the external dummy protruded electrode pads 26b are formed so as not to be connected even to both the wirings 24 and the circuit element connecting pads 18, such a configuration as to be connected to either one or both of the internal dummy protruded electrode pads 26a and the external dummy protruded electrode pads 26b but unused, i.e., so as to be connected thereto but not to electrically function (so as not to be allowed to function electrically) may be adopted.

According to the manufacturing method of the semiconductor device, showing the second embodiment as described above, the external dummy protruded electrodes 28b identical in configuration to the protruded electrodes 28 lying in the semiconductor chip forming area 12 are disposed even in the peripheral area 14 of the semiconductor substrate 10 in such a manner as to be identical in layout interval to the protruded electrodes 28 lying in the semiconductor chip forming area 12. Therefore, the thickness of the encapsulating portion 34 for sealing the protruded electrodes 28 in the center of the semiconductor substrate 10 and at its peripheral portion can be made uniform in addition to an effect obtained by the manufacturing method of the first embodiment.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device, comprising:
    a semiconductor chip which has a main surface;
    circuit elements which are formed on the main surface;
    electrode pads which are formed over the main surface and connected to the circuit elements;
    an insulating film which is formed over the main surface with respective portions of the electrode pads being exposed therefrom;
    protruded electrodes which are formed over the insulating film and are electrically connected to the electrode pads, all of the protruded electrodes being arranged at a first interval; and
    an encapsulating portion which is formed over the insulating film and side surfaces of the protruded electrodes with respective top surfaces of the protruded electrodes being exposed therefrom;
    wherein a second interval between an edge of the semiconductor chip and an outermost protruded electrode is smaller than the first interval.

2. A semiconductor device according to claim 1, further comprising a wiring which extends from one of the electrode pads to one of the protruded electrodes.

3. A semiconductor device according to claim 1, wherein the second interval is smaller than one-half of the first interval.

4. A semiconductor device according to claim 3, further comprising a wiring which extends from one of the electrode pads to one of the protruded electrodes.

5. A semiconductor device, comprising:
    a semiconductor chip which has a main surface;
    circuit elements which are formed on the main surface;
    electrode pads which are formed over the main surface and connected to the circuit elements;
    an insulating film which is formed over the main surface with respective portions of the electrode pads being exposed therefrom;
    protruded electrodes which are formed over the insulating film, all of the protruded electrodes being arranged at a first interval and including a dummy protruded electrode; and
    an encapsulating portion which is formed over the insulating film and side surfaces of the protruded electrodes with respective top surfaces of the protruded electrodes being exposed therefrom;
    wherein a second interval between an edge of the semiconductor chip and an outermost protruded electrode is smaller than the first interval.

6. A semiconductor device according to claim 5, further comprising a wiring which extends from the one of electrode pads to one of the protruded electrodes.

7. A semiconductor device according to claim 5, wherein the second interval is smaller than one-half of the first interval.

8. A semiconductor device according to claim 7, further comprising a wiring which extends from one of the electrode pads to one of the protruded electrodes.

9. A semiconductor device, comprising:
    a semiconductor chip which has a main surface;
    circuit elements which are formed on the main surface;
    electrode pads which are formed over the main surface and connected to the circuit elements;
    an insulating film which is formed over the main surface with respective portions of the electrode pads being exposed therefrom;
    re-distribution wirings which extend from the electrode pads to a top surface of the insulating film;
    protruded electrodes which are formed on portions of the re-distribution wirings, all of the protruded electrodes being arranged at a first interval; and
    an encapsulating material which is formed over the insulating film, the re-distribution wirings, and side surfaces of the protruded electrodes with respective top surfaces of the protruded electrodes being exposed therefrom;

wherein a second interval between an edge of the semiconductor chip and an outermost protruded electrode is smaller than the first interval.

10. A semiconductor device according to claim 9, wherein the second interval is smaller than one-half of the first interval.

11. A semiconductor device, comprising:

a semiconductor chip which has a main surface;

circuit elements which are formed on the main surface;

electrode pads which are formed over the main surface and connected to the circuit elements;

an insulating film which is formed over the main surface with respective portions of the electrode pads being exposed therefrom;

re-distribution wirings which extend from the electrode pads to a top surface of the insulating film;

protruded electrodes which are formed on portions of the re-distribution wirings, all of the protruded electrodes being arranged at a first interval and including a dummy protruded electrode; and an encapsulating material which is formed over the insulating film, the re-distribution wirings, and side surfaces of the protruded electrodes with respective top surfaces of the protruded electrodes being exposed therefrom;

wherein a second interval between an edge of the semiconductor chip and an outermost protruded electrode is smaller than the first interval.

12. A semiconductor device according to claim 11, wherein the second interval is smaller than one-half of the first interval.

* * * * *